(12) United States Patent
Yudovsky et al.

(10) Patent No.: US 9,175,394 B2
(45) Date of Patent: Nov. 3, 2015

(54) ATOMIC LAYER DEPOSITION CHAMBER WITH MULTI INJECT

(75) Inventors: Joseph Yudovsky, Campbell, CA (US); Anh N. Nguyen, Milpitas, CA (US); Tai T. Ngo, Dublin, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 968 days.

(21) Appl. No.: 13/043,189

(22) Filed: Mar. 8, 2011

(65) Prior Publication Data

US 2011/0223334 A1 Sep. 15, 2011

Related U.S. Application Data

(60) Provisional application No. 61/313,573, filed on Mar. 12, 2010.

(51) Int. Cl.
*C23C 16/44* (2006.01)
*C23C 16/455* (2006.01)
(Continued)

(52) U.S. Cl.
CPC ....... *C23C 16/45574* (2013.01); *C23C 16/4408* (2013.01); *C23C 16/45504* (2013.01);
(Continued)

(58) Field of Classification Search
CPC ....... B01F 3/02; B01F 5/0656; C23C 16/455; C23C 16/45504; C23C 16/45508; C23C 16/45512; C23C 16/45523; C23C 16/45525–16/45555; C23C 16/45527–16/45534; C23C 16/45536–16/45542; C23C 16/45544; C23C 16/45546; C23C 16/45561; C23C 16/45563–16/4558; C23C 16/45565; C23C 16/45574; C23C 16/45582; C23C 16/45591; C30B 25/14; C30B 25/16; C30B 25/165; C30B 31/16; H01J 37/3244; H01J 37/32449; H01L 21/0228; H01L 21/28194; H01L 21/3141; H01L 21/67161; Y10T 137/2093–137/2104; Y10T 137/2109–137/2115
USPC .................. 118/715, 733; 156/345.1, 345.33, 156/345.34
See application file for complete search history.

(56) References Cited

U.S. PATENT DOCUMENTS 3,880,112 A * 4/1975 Spitz et al. .................... 118/715
4,949,671 A * 8/1990 Davis et al. .................... 118/725
(Continued)

FOREIGN PATENT DOCUMENTS

| KR | 2004-0042892 A | 5/2004 |
| KR | 20070015959 A | 2/2007 |
| KR | 20090083404 A | 8/2009 |

OTHER PUBLICATIONS

G. Boothroyd et al., Product Design for Manufacture and Assembly: 2nd Edition, Chapter 3—Product Design for Manual Assembly, pp. 85-145, 2002, Marcel Dekker, Inc.*

(Continued)

*Primary Examiner* — Jeffrie R Lund
*Assistant Examiner* — Stanislav Antolin
(74) *Attorney, Agent, or Firm* — Patterson & Sheridan, LLP (57) ABSTRACT

Embodiments of the invention relate to apparatus and methods for depositing materials on substrates during atomic layer deposition processes. In one embodiment, a chamber lid assembly comprises a channel having an upper portion and a lower portion, wherein the channel extends along a central axis, a housing having an inner region and at least partially defining two or more annular channels, an insert disposed in the inner region and defining the upper portion, the upper portion fluidly coupled with the two or more annular channels, and a tapered bottom surface extending from the bottom portion of the channel to a peripheral portion of the chamber lid assembly.

18 Claims, 9 Drawing Sheets

(51) Int. Cl.
*H01J 37/32* (2006.01)
*H01L 21/28* (2006.01)
*H01L 21/31* (2006.01)
*H01L 21/02* (2006.01)
*H01L 21/314* (2006.01)

(52) U.S. Cl.
CPC ..... *C23C16/45544* (2013.01); *C23C 16/45561* (2013.01); *C23C 16/45591* (2013.01); *H01J 37/32449* (2013.01); *C23C 16/45525* (2013.01); *H01L 21/0228* (2013.01); *H01L 21/28194* (2013.01); *H01L 21/3141* (2013.01)

(56) References Cited

U.S. PATENT DOCUMENTS

| | | | | |
|---|---|---|---|---|
| 5,374,315 | A * | 12/1994 | deBoer et al. | 118/725 |
| 5,445,677 | A * | 8/1995 | Kawata et al. | 118/724 |
| 5,695,564 | A * | 12/1997 | Imahashi | 118/719 |
| 5,846,330 | A * | 12/1998 | Quirk et al. | 118/715 |
| 5,851,294 | A * | 12/1998 | Young et al. | 118/715 |
| 5,885,358 | A * | 3/1999 | Maydan et al. | 118/723 R |
| 6,051,286 | A * | 4/2000 | Zhao et al. | 427/576 |
| 6,063,441 | A * | 5/2000 | Koai et al. | 427/248.1 |
| 6,068,703 | A * | 5/2000 | Chen et al. | 118/715 |
| 6,090,206 | A * | 7/2000 | Bang et al. | 118/715 |
| 6,092,486 | A * | 7/2000 | Mabuchi et al. | 118/723 MW |
| 6,210,485 | B1 * | 4/2001 | Zhao et al. | 118/724 |
| 6,245,149 | B1 * | 6/2001 | de Lomenie et al. | 118/719 |
| 6,303,501 | B1 * | 10/2001 | Chen et al. | 438/680 |
| 6,375,750 | B1 * | 4/2002 | van Os et al. | 118/728 |
| 6,786,998 | B1 * | 9/2004 | Cleeves | 156/345.51 |
| 7,204,886 | B2 | 4/2007 | Chen et al. | |
| 7,279,049 | B2 * | 10/2007 | Kaszuba et al. | 118/728 |
| 7,780,789 | B2 * | 8/2010 | Wu et al. | 118/715 |
| 2001/0011526 | A1 * | 8/2001 | Doering et al. | 118/729 |
| 2001/0054381 | A1 * | 12/2001 | Umotoy et al. | 118/715 |
| 2003/0019428 | A1 * | 1/2003 | Ku et al. | 118/715 |
| 2004/0144311 | A1 * | 7/2004 | Chen et al. | 118/715 |
| 2005/0139160 | A1 * | 6/2005 | Lei et al. | 118/715 |
| 2005/0208217 | A1 * | 9/2005 | Shinriki et al. | 427/248.1 |
| 2005/0252449 | A1 | 11/2005 | Nguyen et al. | |
| 2006/0137608 | A1 * | 6/2006 | Choi et al. | 118/715 |
| 2007/0051312 | A1 * | 3/2007 | Sneh | 118/719 |
| 2007/0131282 | A1 * | 6/2007 | Mohammed et al. | 137/487.5 |
| 2007/0151514 | A1 * | 7/2007 | Chen et al. | 118/715 |
| 2008/0107809 | A1 * | 5/2008 | Wu et al. | 427/248.1 |
| 2008/0202425 | A1 * | 8/2008 | Gelatos et al. | 118/724 |
| 2008/0206987 | A1 * | 8/2008 | Gelatos et al. | 438/654 |
| 2008/0268171 | A1 | 10/2008 | Ma et al. | |
| 2008/0268645 | A1 * | 10/2008 | Kao et al. | 438/694 |
| 2009/0029046 | A1 * | 1/2009 | Kudoh et al. | 427/248.1 |
| 2010/0003406 | A1 * | 1/2010 | Lam et al. | 427/255.391 |

OTHER PUBLICATIONS

International Search Report and Written Opinion of the International Searching Authority dated Sep. 29, 2011 for PCT/US2011/027599.
Extended European Search Report for Application No. 11753949.4-1353 dated Dec. 14, 2013.

* cited by examiner

ATOMIC LAYER DEPOSITION CHAMBER WITH MULTI INJECT

CROSS-REFERENCE TO RELATED APPLICATIONS

This application claims benefit of U.S. Provisional Patent Application Ser. No. 61/313,573, filed Mar. 12, 2010, which is herein incorporated by reference.

BACKGROUND OF THE INVENTION

1. Field of the Invention

Embodiments of the invention generally relate to apparatus and methods for atomic layer deposition. More particularly, embodiments of the invention relate to improved gas delivery apparatus and methods for atomic layer deposition.

2. Description of the Related Art

Reliably producing submicron and smaller features is one of the key technologies for the next generation of very large scale integration (VLSI) and ultra large scale integration (ULSI) of semiconductor devices. However, as the fringes of circuit technology are pressed, the shrinking dimensions of interconnects in VLSI and ULSI technology have placed additional demands on the processing capabilities. The multilevel interconnects that lie at the heart of this technology require precise processing of high aspect ratio features, such as vias and other interconnects. Reliable formation of these interconnects is very important to VLSI and ULSI success and to the continued effort to increase circuit density and quality of individual substrates.

As circuit densities increase, the widths of interconnects, such as vias, trenches, contacts, and other features, as well as the dielectric materials between, decrease to 45 nm and 32 nm dimensions, whereas the thickness of the dielectric layers remain substantially constant, with the result of increasing the aspect ratios of the features. Many traditional deposition processes have difficulty filling submicron structures where the aspect ratio exceeds 4:1, and particularly where the aspect ratio exceeds 10:1. Therefore, there is a great amount of ongoing effort being directed at the formation of substantially void-free and seam-free submicron features having high aspect ratios.

Atomic layer deposition (ALD) is a deposition technique being explored for the deposition of material layers over features having high aspect ratios. One example of an ALD process includes the sequential introduction of pulses of gases. For instance, one cycle for the sequential introduction of pulses of gases may contain a pulse of a first reactant gas, followed by a pulse of a purge gas and/or a pump evacuation, followed by a pulse of a second reactant gas, and followed by a pulse of a purge gas and/or a pump evacuation. The term "gas" as used herein is defined to include a single gas or a plurality of gases. Sequential introduction of separate pulses of the first reactant and the second reactant may result in the alternating self-limiting absorption of monolayers of the reactants on the surface of the substrate and, thus, forms a monolayer of material for each cycle. The cycle may be repeated to a desired thickness of the deposited material. A pulse of a purge gas and/or a pump evacuation between the pulses of the first reactant gas and the pulses of the second reactant gas serves to reduce the likelihood of gas phase reactions of the reactants due to excess amounts of the reactants remaining in the chamber.

As monolayers of the first reactant and the second reactants are necessary for the formation of layer, it has been observed in some chamber designs for ALD processing that the gas flow from a conventional ALD chamber injection process does not provide a uniform annular gas flow, which results in localized thin spots on the substrate surface.

Therefore, there is a need for apparatuses and methods used to deposit films during ALD processes with more uniform gas flows.

SUMMARY OF THE INVENTION

Embodiments of the invention relate to apparatus and methods for uniformly depositing materials on a substrate during an atomic layer deposition (ALD) process. In one embodiment, a chamber lid assembly comprises a channel having an upper portion and a lower portion, wherein the channel extends along a central axis, a housing having an inner region and at least partially defining two or more annular channels, an insert disposed in the inner region and defining the upper portion, the upper portion fluidly coupled with the two or more annular channels, and a tapered bottom surface extending from the bottom portion of the channel to a peripheral portion of the chamber lid assembly.

In one embodiment, a method for processing substrates includes flowing two or more process gases from one or more fluid sources through fluid delivery lines of a chamber lid assembly, flowing the two or more process gases from the fluid delivery lines through two or more annular channels at least partially defined by a housing of the chamber lid assembly, the housing having an inner region, flowing the two or more process gases from the two or more annular channels through an insert disposed in the inner region and into an upper portion of a channel in the chamber lid assembly, the insert defining the upper portion of the channel, and flowing the one or more process gases through the channel and into a reaction zone above a substrate disposed on a substrate support.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention provide apparatus and methods that may be used to deposit materials during an atomic layer deposition (ALD) process. Embodiments include ALD process chambers and gas delivery systems which include a multiple injection lid assembly. Other embodiments provide methods for depositing materials using these gas delivery systems during ALD processes. Examples of suitable processing chambers for incorporation of the apparatuses described herein include high k dielectric constant and metal ALD deposition chambers available from Applied Materials, Inc., of Santa Clara, Calif. The following process chamber description is provided for context and exemplary purposes, and should not be interpreted or construed as limiting the scope of the invention.

Figure 1A:
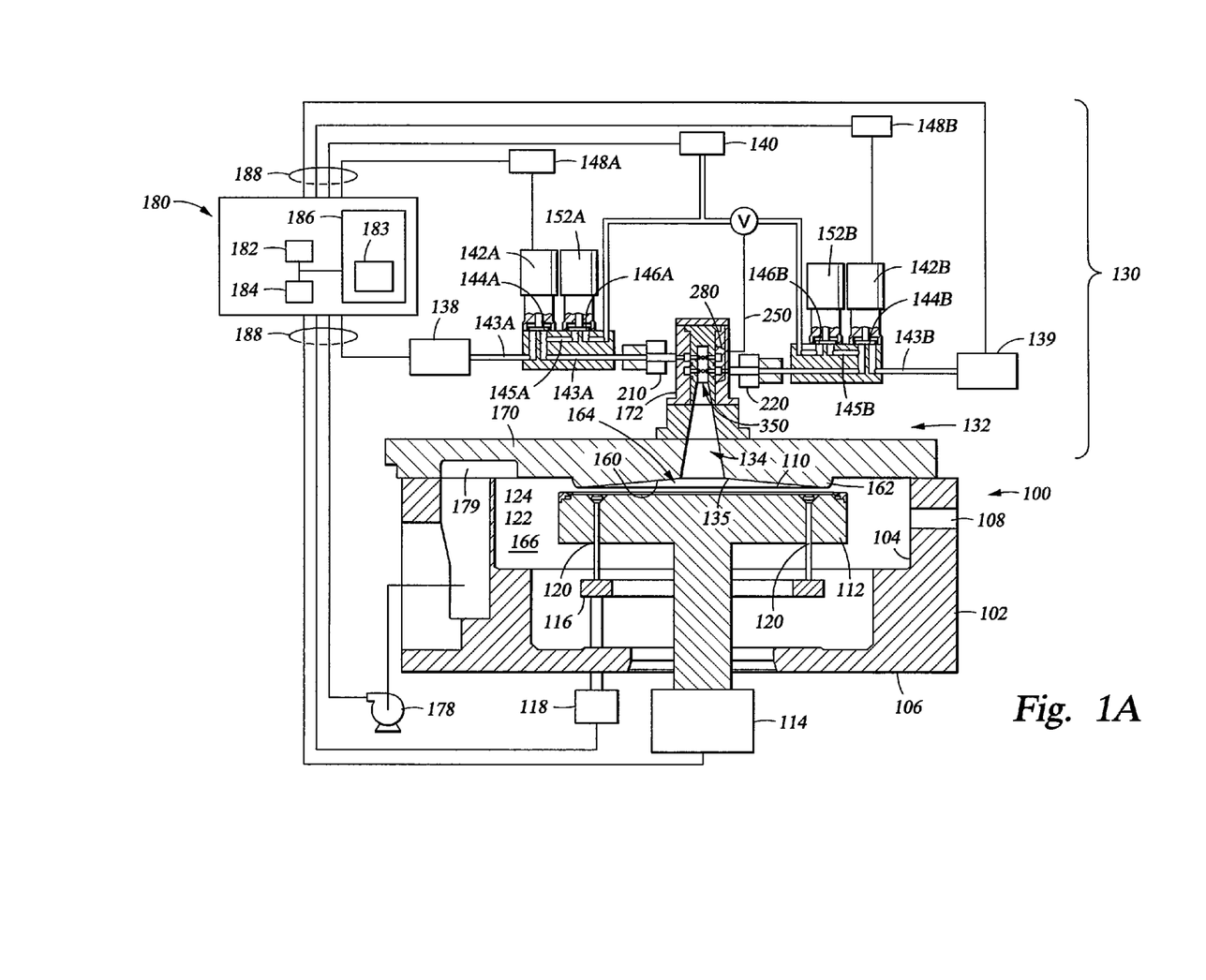
FIG. 1A depicts a schematic cross-sectional view of a process chamber including a lid assembly and a gas delivery apparatus adapted for atomic layer deposition as described in one embodiment herein.
Figure 1B:
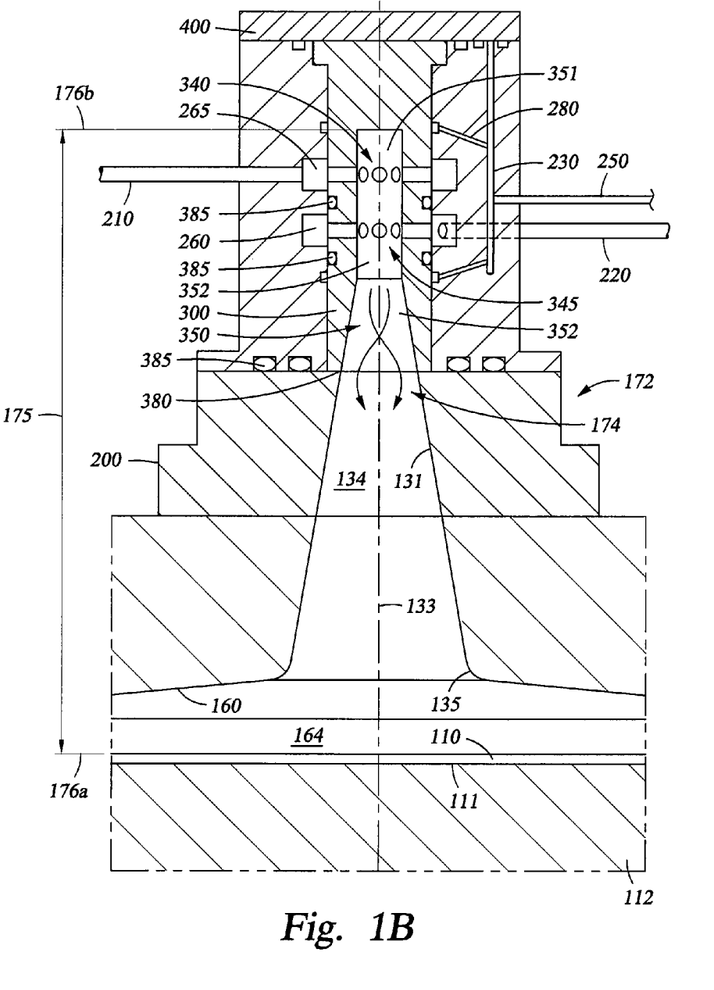
FIG. 1B depicts a schematic cross-sectional view of a lid assembly and a gas delivery apparatus adapted for atomic layer deposition as described in one embodiment herein.
Figure 1C:
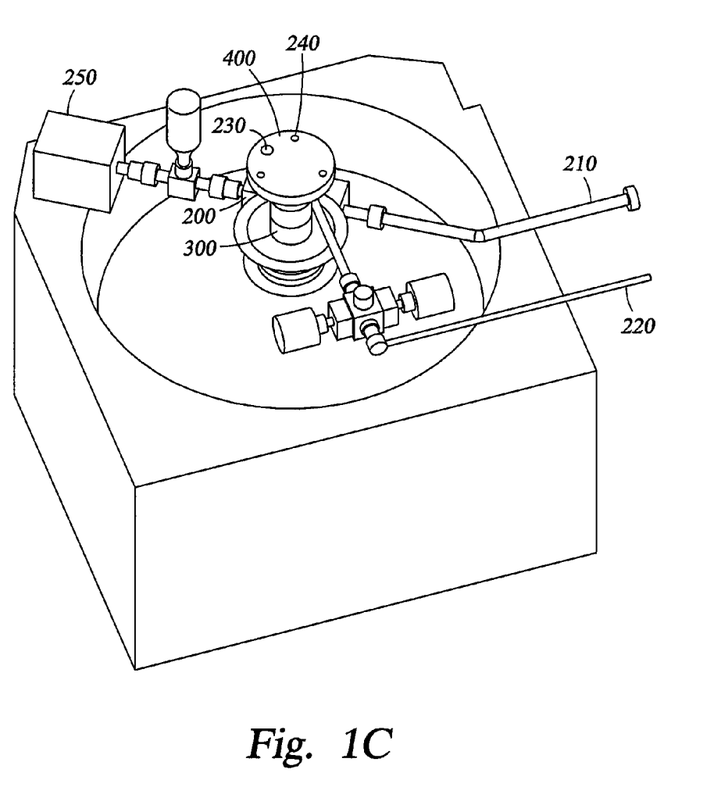
FIG. 1C depicts a perspective view of a top portion of the lid assembly and a gas delivery apparatus adapted for atomic layer deposition as described in one embodiment herein.
Figure 1D:
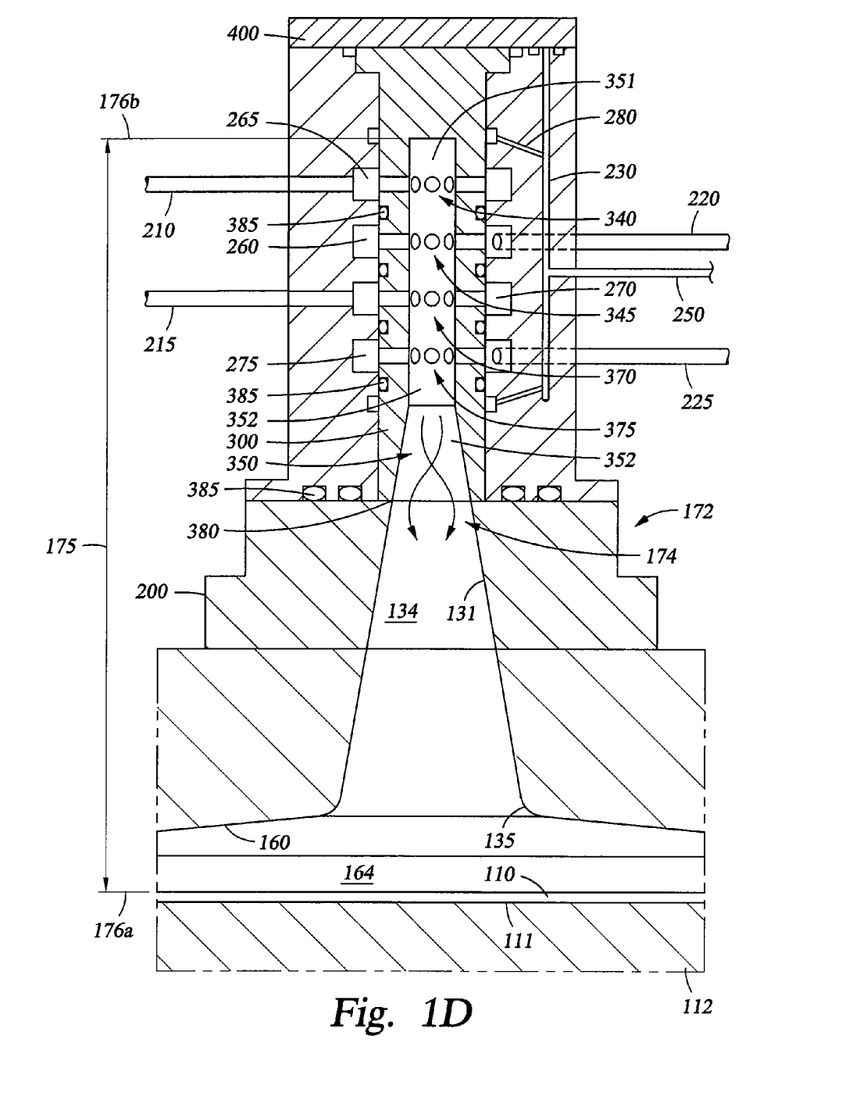
FIG. 1D depicts a schematic cross-sectional view of a lid assembly and a gas delivery apparatus adapted for atomic layer deposition as described in one embodiment herein.

FIGS. 1A-1C are schematic views of one embodiment of a process chamber 100 including gas delivery system 130 adapted for ALD processes. FIG. 1D is a schematic view of process chamber 100 including another embodiment of gas delivery system 130. Process chamber 100 includes chamber body 102 having sidewalls 104 and bottom 106. Slit valve 108 in process chamber 100 provides access for a robot (not shown) to deliver and retrieve substrate 110, such as a 200 mm or 300 mm semiconductor wafer or a glass substrate, to and from process chamber 100.

Substrate support 112 supports substrate 110 on substrate receiving surface 111 in process chamber 100. Substrate support 112 is mounted to lift motor 114 for raising and lowering substrate support 112 and substrate 110 disposed thereon. Lift plate 116 connected to lift motor 118 is mounted in process chamber 100 and raises and lowers lift pins 120 movably disposed through substrate support 112. Lift pins 120 raise and lower substrate 110 over the surface of substrate support 112. Substrate support 112 may include a vacuum chuck (not shown), an electrostatic chuck (not shown), or a clamp ring (not shown) for securing substrate 110 to substrate support 112 during a deposition process.

The temperature of substrate support 112 may be adjusted to control the temperature of substrate 110 disposed thereon. For example, substrate support 112 may be heated using an embedded heating element, such as a resistive heater (not shown), or may be heated using radiant heat, such as heating lamps (not shown) disposed above substrate support 112.

Purge ring 122 may be disposed on substrate support 112 to define purge channel 124 which provides a purge gas to a peripheral portion of substrate 110 to prevent deposition thereon.

Gas delivery system 130 is disposed at an upper portion of chamber body 102 to provide a gas, such as a process gas and/or a purge gas, to process chamber 100. FIGS. 1A-1D depict gas delivery system 130 configured to expose substrate 110 to at least two gas sources or chemical precursors. FIG. 1B is a cross-sectional view along line 1B of FIG. 1A. Vacuum system 178 is in communication with pumping channel 179 to evacuate any desired gases from process chamber 100 and to help maintain a desired pressure or a desired pressure range inside pumping zone 166 of process chamber 100.

In one embodiment, gas delivery system 130 contains chamber lid assembly 132 having gas dispersing channel 134 extending through a central portion of chamber lid assembly 132. Gas dispersing channel 134 extends perpendicular towards substrate receiving surface 111 and also extends along central axis 133 of gas dispersing channel 134, through lid plate 170, and to lower surface 160. In one example, a portion of gas dispersing channel 134 is substantially cylindrical along central axis 133 within upper portion 350 and a portion of gas dispersing channel 134 that tapers away from central axis 133 within lower portion 135 of gas dispersing channel 134. Gas dispersing channel 134 further extends past lower surface 160 and into reaction zone 164. Lower surface 160 extends from lower portion 135 of gas dispersing channel 134 to choke 162. Lower surface 160 is sized and shaped to substantially cover substrate 110 disposed on substrate receiving surface 111 of substrate support 112.

Processing gases are forced to make revolutions around central axis 133 of gas dispersing channel 134 while passing through the dispersing channel. Circular gas flows 174, which illustrate the flow of process gases through the dispersing channel, may contain various types of flow patterns, such as a vortex pattern, a helix pattern, a spiral pattern, or derivatives thereof. Circular gas flows 174 may extend at least about 1 revolution around central axis 133 of gas dispersing channel 134, preferably, at least about 1.5 revolutions, more preferably, at least about 2 revolutions, more preferably, at least about 3 revolutions, and more preferably, about 4 revolutions or more.

Gas dispersing channel 134 including upper portion 350 has gas inlets 340, 345 to provide gas flows from two similar pairs of valves 142A/152A, 142B/152B, which may be provided together and/or separately. In one configuration, valve 142A and valve 142B are coupled to separate reactant gas sources but are preferably coupled to the same purge gas source. For example, valve 142A is coupled to reactant gas source 138 and valve 142B is coupled to reactant gas source 139, and both valves 142A, 142B are coupled to purge gas source 140. Each valve 142A, 142B includes delivery line 143A, 143B having valve seat assembly 144A, 144B and each valve 152A, 152B includes purge line 145A, 145B having valve seat assembly 146A, 146B. Delivery line 143A, 143B is in fluid communication with reactant gas sources 138 and 139 and is in fluid communication with gas inlet 340, 345 of gas dispersing channel 134. Valve seat assembly 144A, 144B of the delivery line 143A, 143B controls the flow of the reactant gas from reactant gas sources 138 and 139 to gas dispersing channel 134. Purge line 145A, 145B is in communication with purge gas source 140 and intersects delivery line 143A, 143B downstream of valve seat assembly 144A, 144B of delivery line 143A, 143B. Valve seat assembly 146A, 146B of purge line 145A, 145B controls the flow of the purge gas from purge gas source 140 to gas dispersing channel 134. If a carrier gas is used to deliver reactant gases from reactant gas sources 138 and 139, preferably the same gas is used as a carrier gas and a purge gas (e.g., an argon gas used as a carrier gas and a purge gas).

Each valve seat assembly 144A, 144B, 146A, 146B may contain a diaphragm (not shown) and a valve seat (not shown). The diaphragm may be biased open or closed and may be actuated closed or open respectively. The diaphragms may be pneumatically actuated or may be electrically actuated. Pneumatically actuated valves include pneumatically actuated valves available from Fujikin, Inc. and Veriflo Division, Parker Hannifin, Corp. Electrically actuated valves include electrically actuated valves available from Fujikin, Inc. For example, an ALD valve that may be used is the Fujikin Model No. FPR-UDDFAT-21-6.35-PI-ASN or the Fujikin Model No. FPR-NHDT-21-6.35-PA-AYT. Programmable logic controllers 148A, 148B may be coupled to valves 142A, 142B to control actuation of the diaphragms of valve seat assemblies 144A, 144B, 146A, 146B of valves 142A, 142B. Pneumatically actuated valves may provide pulses of gases in time periods as low as about 0.020 seconds. Electrically actuated valves may provide pulses of gases in time periods as low as about 0.005 seconds. An electrically actuated valve typically requires the use of a driver coupled between the valve and the programmable logic controller.

Each valve 142A, 142B may be a zero dead volume valve to enable flushing of a reactant gas from delivery line 143A, 143B when valve seat assembly 144A, 144B is closed. For example, purge line 145A, 145B may be positioned adjacent valve seat assembly 144A, 144B of delivery line 143A, 143B. When valve seat assembly 144A, 144B is closed, purge line 145A, 145B may provide a purge gas to flush delivery line 143A, 143B. In one embodiment, purge line 145A, 145B is positioned slightly spaced from valve seat assembly 144A, 144B of delivery line 143A, 143B so that a purge gas is not directly delivered into valve seat assembly 144A, 144B when open. A zero dead volume valve as used herein is defined as a valve which has negligible dead volume (i.e., not necessarily zero dead volume).

Each valve pair 142A/152A, 142B/152B may be adapted to provide a combined gas flow and/or separate gas flows of the reactant gas and the purge gas. In reference to valve pair 142A/152A, one example of a combined gas flow of the reactant gas and the purge gas includes a continuous flow of a purge gas from purge gas source 140 through purge line 145A and pulses of a reactant gas from reactant gas source 138 through delivery line 143A. The continuous flow of the purge gas may be provided by leaving the diaphragm of valve seat assembly 146A of purge line 145A open. The pulses of the reactant gas from reactant gas source 138 may be provided by opening and closing the diaphragm of valve seat assembly 144A of delivery line 143A. In reference to valve pair 142A/152A, one example of separate gas flows of the reactant gas and the purge gas includes pulses of a purge gas from purge gas source 140 through purge line 145A and pulses of a reactant gas from reactant gas source 138 through delivery line 143A. The pulses of the purge gas may be provided by opening and closing the diaphragm of valve seat assembly 146A of purge line 145A. The pulses of the reactant gas from reactant gas source 138 may be provided by opening and closing the diaphragm of valve seat assembly 144A of delivery line 143A.

Delivery lines 143A, 143B of valves 142A, 142B may be coupled with gas inlets 340, 345 through fluid delivery lines 210, 220 and annular channels 260, 265. Fluid delivery lines 210, 220 may be integrated or may be separate from valves 142A, 142B, and thereby connected to one or more fluid sources. In one aspect, valves 142A, 142B are coupled in close proximity to gas dispersing channel 134 to reduce any unnecessary volume of delivery line 143A, 143B and fluid delivery lines 210, 220 between valves 142A, 142B and gas inlets 340, 345.

Not wishing to be bound by theory, it is believed that the diameter of gas dispersing channel 134, which is constant from upper portion 350 of gas dispersing channel 134 to some point along central axis 133 and increasing from this point to lower portion 135 of gas dispersing channel 134, allows less of an adiabatic expansion of a gas through gas dispersing channel 134 which helps to control the temperature of the process gas contained in circular gas flow 174. For instance, a sudden adiabatic expansion of a gas delivered into gas dispersing channel 134 may result in a drop in the temperature of the gas which may cause condensation of the gas and formation of droplets. On the other hand, gas dispersing channel 134 that gradually tapers is believed to provide less of an adiabatic expansion of a gas. Therefore, more heat may be transferred to or from the gas, and, thus, the temperature of the gas may be more easily controlled by controlling the temperature of chamber lid assembly 132. Gas dispersing channel 134 may gradually taper and contain one or more tapered inner surfaces, such as a tapered straight surface, a concave surface, a convex surface, or combinations thereof or may contain sections of one or more tapered inner surfaces (i.e., a portion tapered and a portion non-tapered).

FIG. 1D is a similar view of the process chamber 100 as shown in FIG. 1B, and may include similar features and components. FIG. 1D illustrates an embodiment of the gas delivery system 130 that includes four fluid delivery lines 210, 215, 220, 225 coupled with gas inlets 340, 345, 370, 375 of the dispersing channel 134 to provide gas flows from similar pairs of valves as described previously. In this embodiment, gas dispersing channel 134 including upper portion 350 has four sets of gas inlets 340, 345, 370, 375 to provide gas flows from pairs of valves, which may be provided together and/or separately. Delivery lines of valves may be coupled with gas inlets 340, 345, 370, 375 through fluid delivery lines 210, 215, 220, 225 and annular channels 260, 265, 270, 275.

The chamber lid assembly comprises a channel 134 extending and expanding along a central axis at portion of the chamber lid assembly. An upper portion 350 of channel 134 is defined by an insert 300 disposed in a housing 200. A cap 400 may be disposed on the housing 200 and insert 300.

Figure 2A:
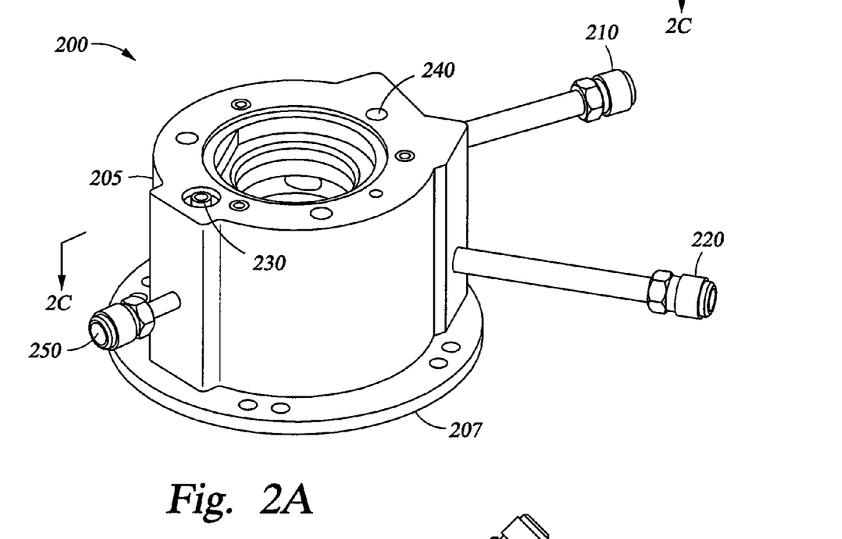
FIG. 2A depicts a perspective view of one embodiment of a housing for a lid assembly and a gas delivery apparatus adapted for atomic layer deposition as described in one embodiment herein.
Figure 2B:
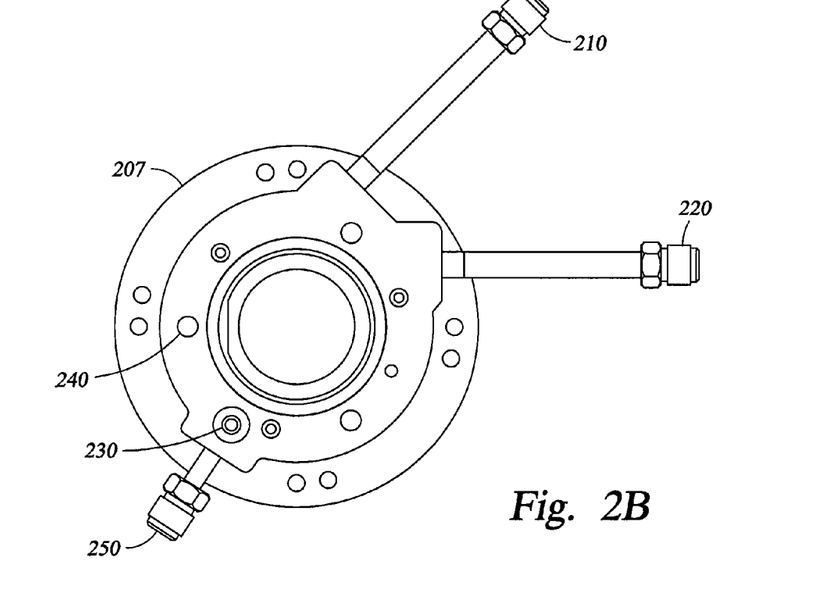
FIG. 2B depicts a top view of one embodiment of a housing for a lid assembly and a gas delivery apparatus from FIG. 2A.
Figure 2C:
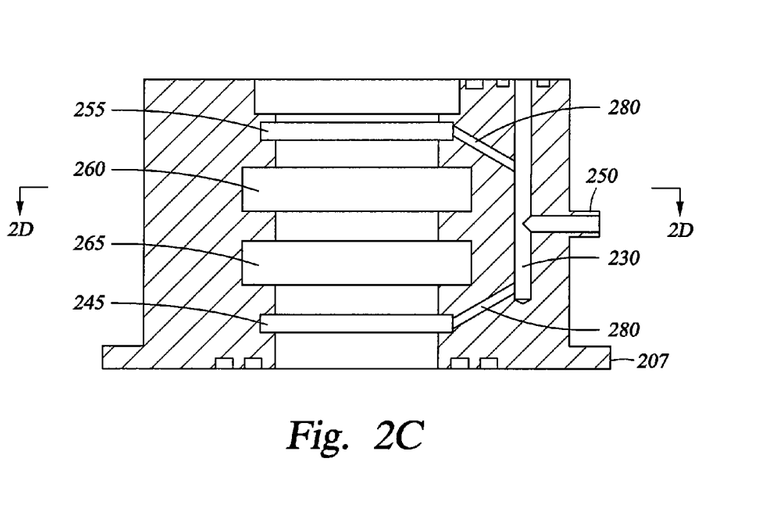
FIG. 2C depicts a schematic cross-sectional view of one embodiment of a lid assembly and a gas delivery apparatus from FIG. 2A.

The housing 200 may comprise an annular manifold 205 disposed on a base 207. In embodiments as shown in FIGS. 2A-2G, the annular manifold 205 defines an inner region 290 and at least partially defines two or more annular channels disposed around the inner region 290. FIG. 2C is a cross-section view along line 2C of FIG. 2A. FIG. 2D is a cross-section view along line 2D of FIG. 2C. In an alternative embodiment, the annular manifold 205 defines an inner region 290 and includes an annular channel disposed around the inner region 290. FIG. 2F is another embodiment showing three fluid delivery lines and two annular channels. FIG. 2G is a cross-section view along line 2G of FIG. 2F.

The two or more annular channels are disposed in a vertically spaced manner from each other along the central axis 133 of the annular manifold 205. An annular channel, such as annular channel 260, comprises a channel adapted for flowing a fluid therein, and partially or completely surrounds the inner region 290. The annular channel may provide for fluid communication of up to 360° for the inner region, for example from 270° to 360°, around the inner region. Each annular channel allows for a fluid, such as a processing gas, to be delivered from a fluid source (e.g. a gas source) to the inner region for dispersing fluids through apertures formed in the insert 300 coupled with the annular manifold 205. Each of the annular channels may have various cross-section shapes and designs. For example, the annular channel may be a circular, half-circle, rectangular, or ellipsoidal cross-section design. Preferably, the cross-section design is adapted to provide for an effective flow of a fluid, such as a processing gas, from the annular channel to apertures coupled with the annular channel. For example, the annular channel may comprise three sides of a rectangular cross-section and the fourth side may be the vertical body 330 of the insert 300. In this manner, the three rectangular cross-section sides and the fourth side of the vertical body 330 of the insert 300 together define the annular channel.

Figure 2D:
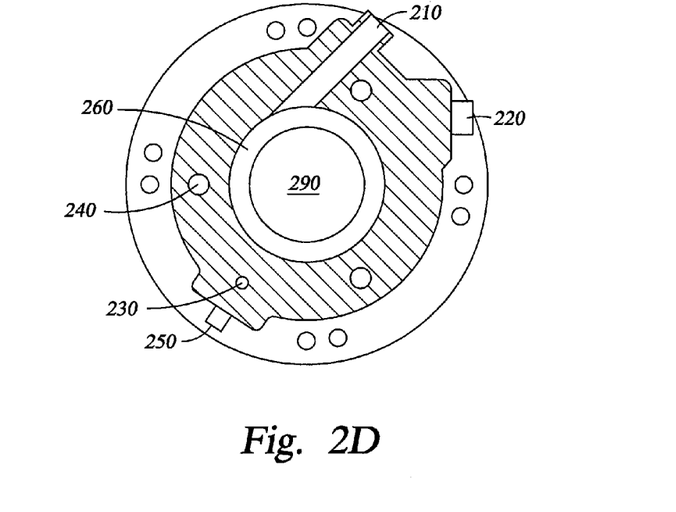
FIG. 2D depicts a schematic cross-sectional view of one embodiment of a lid assembly and a gas delivery apparatus from FIG. 2A.
Figure 2E:
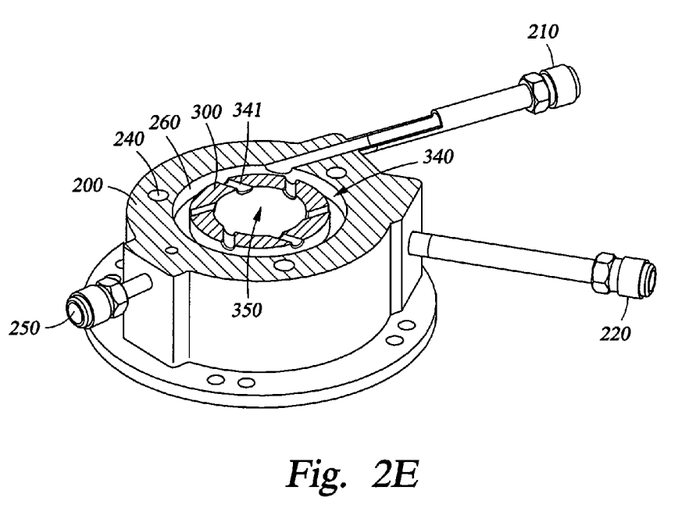
FIG. 2E depicts a perspective cross-sectional view of one embodiment of a lid assembly and a gas delivery apparatus from FIG. 1A.
Figure 2F:
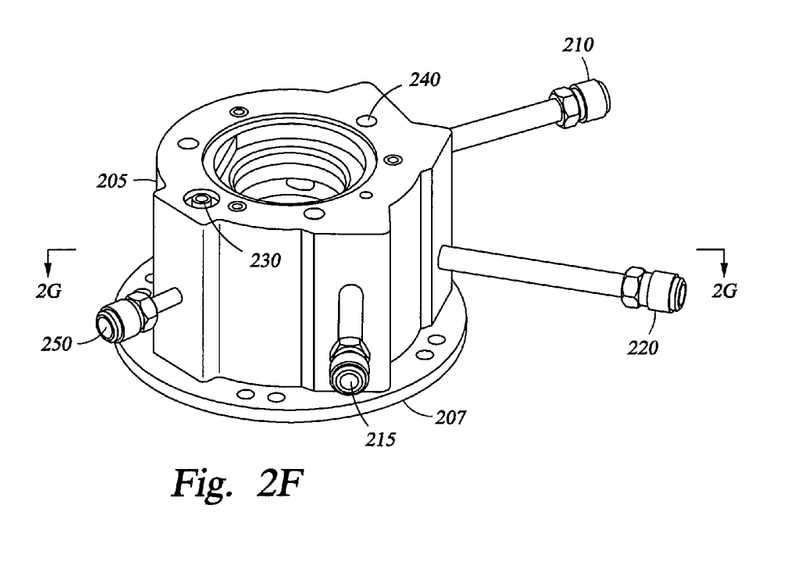
FIG. 2F depicts a schematic cross-sectional view of one embodiment of a lid assembly and a gas delivery apparatus.
Figure 2G:
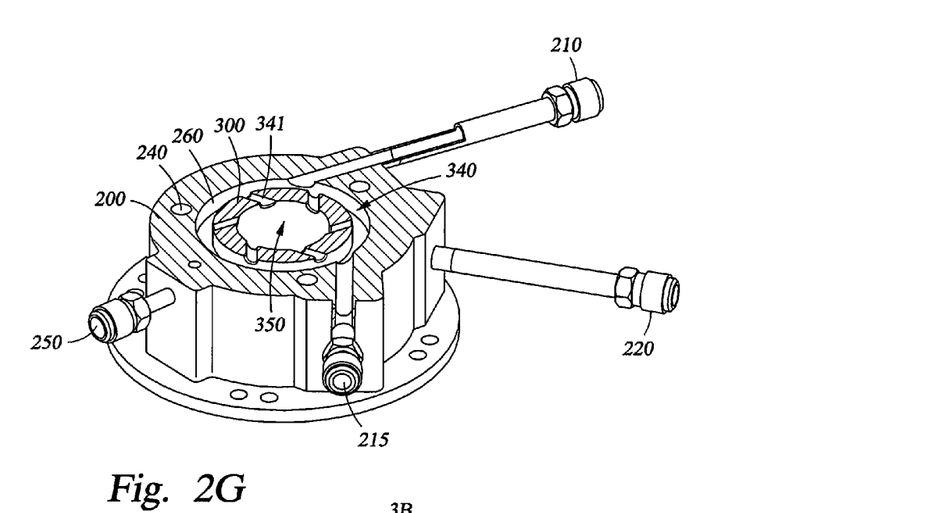
FIG. 2G depicts a perspective cross-sectional view of one embodiment of a lid assembly and a gas delivery apparatus from FIG. 2F.

In one embodiment, each annular channel circumferentially spans the inner region 290, such as annular channel 260, and provides for fluid communication of 360° of the inner region, as shown in FIGS. 2D and 2E. In an alternative embodiment, one of the annular channels may have a fluid communication of 360° and at least a second annular channel of less than 360°. In one embodiment, a first annular channel 260 and a second annular channel 265 are disposed around the inner region 290.

One or more cartridges heaters 240 may be disposed in the annular manifold 205. The housing 200 may be made of stainless steel. The cap 400 may also be made of stainless steel.

Each of the annular channels is coupled with a respective fluid delivery line, such as fluid delivery lines 210, 215, 220, 225 as shown in FIGS. 1D, 2A, and 2F. Alternatively, each of the annular channels may be coupled with two or more fluid delivery lines, such as shown in FIGS. 2F and 2G, which can provide for a mix of gases or alternative gases flowing though the annular channels. Fluid delivery lines 210, 215, and 220 are coupled with annular channels 260, 265. FIG. 2G shows fluid delivery lines 210 and 215 each coupled with annular channel 265.

Each of the fluid lines is coupled with a fluid source, such as a gas source. Alternatively, each of the fluid lines may be coupled with two or more gas sources, which can provide for a mix of gases or alternative gases flowing though the annular channels. The use of multiple annular channels may allow the supply of different precursors, such as hafnium chloride and water for a hafnium oxide deposition process, and/or allow the same precursor with different concentrations. Additionally, a plenum may supply different precursors including mixing precursors or alternating delivery of the precursors.

At least one purge line, such as purge line 250, may also be formed in the annular manifold 205. The purge line is introduced into a vertical portion of the annular manifold 205. The purge line comprises a horizontal gas transport line coupled with one or more gap purge lines 280, which are disposed to contact the inner region 290 above and below the series of annular channels. Each of the gap purge lines 280 at the inner region may have an extending annular channel, such as circumferentially formed annular channel 245, 255, formed at a surface of the annular manifold 205 disposed adjacent the inner region. The purge line 250 is also coupled with a vertically disposed line 230 disposed in the annular manifold 205. The one or more gap purge lines also provide flow of a purge gas along the vertical body 330 of the insert 300 to the material intersection 380 between the insert 300 and the material of the lid cap 172 forming the adjacent gas dispersion channel 134. The purge gas will further prevent processing gases from reacting with any structural sealing materials, such as o-rings 385, disposed between the housing and insert with the underlying material of the lid cap 172 and lid plate assembly forming the adjacent gas dispersion channel 134.

The purge line 250 may be connected to one of the purge gas sources as previously described for the processing chamber, and the purge gas may comprise a non-reactive gas, such as nitrogen or a noble gas. The purge line provides a purge gas between the inserts and the annular manifold 205 to remove unwanted processing gases in those areas. The purge gas thereby protects sensitive materials from the processing gases, such as o-ring materials, that can degrade over time when exposed to the reactive processing gases, such as metal halide precursors.

Figure 3A:
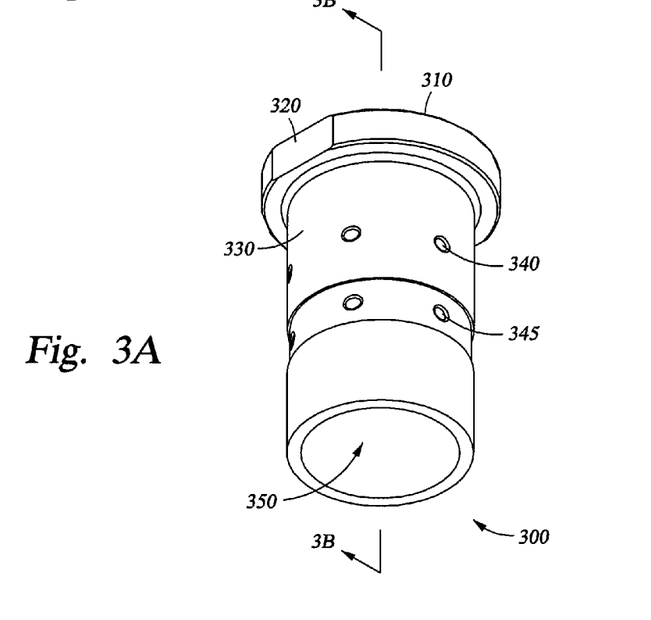
FIG. 3A depicts a perspective view of one embodiment of an insert for a lid assembly and a gas delivery apparatus adapted for atomic layer deposition as described in one embodiment herein.
Figure 3B:
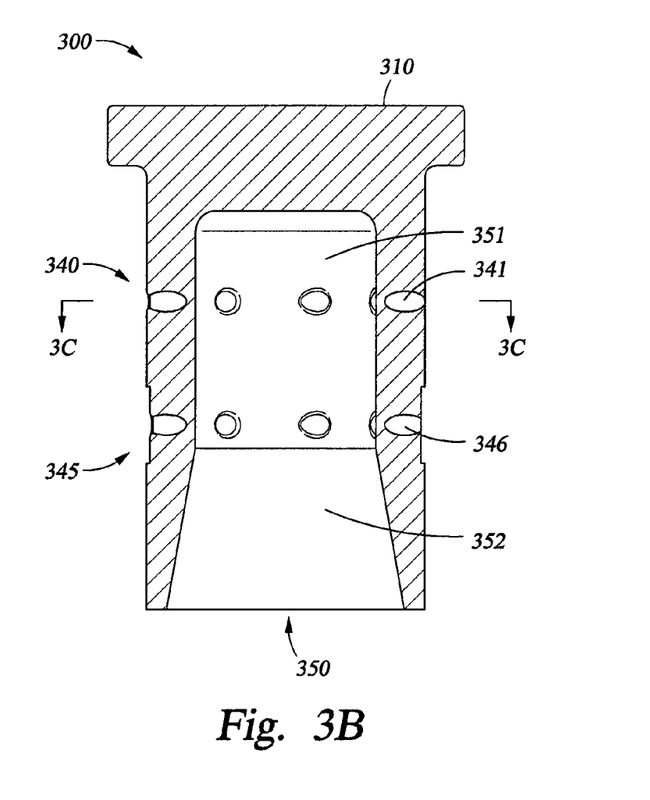
FIG. 3B depicts a schematic cross-sectional view of the lid assembly and gas delivery apparatus in FIG. 3A.
Figure 3C:
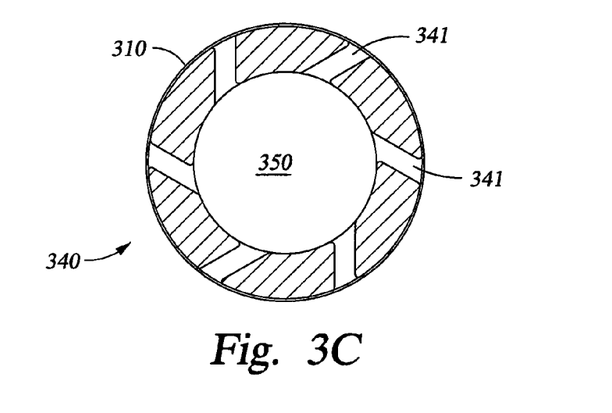
FIG. 3C depicts a schematic cross-sectional view of the lid assembly and a gas delivery apparatus in FIG. 3B.

Referring to FIGS. 3A-3C, an insert 300 is disposed in the inner region 290 and defines upper portion 350 of channel 134. The insert comprises a coupling lid 310 having a truncated portion 320 adapted to be coupled to a top portion of the housing 200, and a vertical body 330 adapted to be disposed in and flushed to the inside of the annular manifold 205. The body 330 defines the upper portion 350. The upper portion may comprise a cylindrical shape or a substantially cylindrical shape. In one example, as shown in FIG. 3B, the upper portion 350 comprises a cylindrical upper portion 351 and an expanding bottom portion 352 with the expanding bottom portion 352 disposed below a bottom set of a plurality of apertures 346.

One or more gas inlets 340, 345 may disposed in the vertical body of the insert 300. The inlets 340, 345 may comprise a plurality of apertures 341, 346 along a horizontal plane at a portion of the vertical body 330, thereby forming multi-aperture inlets 340, 345. The number of apertures 341, 346 along each horizontal plane may be between 2 and 10 apertures, for example, 6 apertures as shown in FIGS. 3A-3C. One or more sets of the plurality of apertures may be formed along the insert 300. The apertures 341, 346 may be disposed equilaterally from each other around the horizontal plane of the vertical body 330. Alternatively, the apertures 341, 346 may be spaced and/or grouped to provide a desired gas flow characteristic into the upper portion 350. It is believed that apertures disposed equilaterally from each other around the horizontal plane of the vertical body 330 in combination with an upper portion 350 form equalization grooves, allowing for the same or substantially the same pressure and gas flow rates through each of the apertures 341, 346 to provide more uniform flow of process gases at the substrate surface.

The apertures 341, 346 may be disposed at any angle relative to central axis 133, such as about tangential to central axis 133 or gas dispersing channel 134 and through the vertical body 330. The apertures 341, 346 may be oriented at different angles to the radial and vertical directions. The apertures 341, 346 are preferably angled from 0° to 90° in a horizontal and/or vertical manner to provide a desired flow characteristic. In one embodiment, apertures 341 and 346 are positioned at an angle tangential to upper portion 350, such as within a range from about 0° to about 90°, preferably from about 0° to about 60°, preferably from about 0° to about 45°, and more preferably from about 0° to about 20°.

The apertures 341, 346 are disposed to be fluidly coupled with the two or more annular channels 260, 265 of the annular manifold 205. Multiple sets of pluralities of the apertures may be used with each inlet corresponding to an annular channel formed in the annular manifold 205. The apertures may be of any cross-section shape, for example, a rectangular shape, a cylindrical tube, or a tear drop shape. It is believed that the combination of the annular channels and inlets having multiple apertures provides more uniform flow of process gases at the substrate surface.

The insert 300 may be made of material that is non-reactive with the processing gases, such as metal halide precursor gases. One such material is quartz. In the configuration shown in the figures, a quartz insert is observed to have increased material compatibility, i.e., a quartz insert has less reactivity with the halide precursors and other processing gases, such as water, than other materials, such as stainless steel or aluminum. Additionally, the insert material may also be more compatible with other structural components of the chamber that the insert 300 may contact. For example, the lid cap 172 and portions of lid plate 170 surrounding the gas dispersing channel 134 are typically made of quartz, with which a quartz insert 300 would have a good material compatibility and be more structurally compatible for manufacturing and assembling.

It is believed that the lid cap described herein with the plurality of apertures (plurality of entry points) forming an inlet provides for more uniform flow of the processing gases over the substrate surface, thereby providing a more uniform thickness in an annular direction as compared to a single entry point/single entry inlet. It was observed that a lower wafer-in-wafer (WiW) thickness can be achieved with an improved thickness uniformity with the multi-annular channel of the lid cap 172 assembly described herein along a 2 inch ring analysis, a 4 inch ring analysis, and at 3 mm from the substrate edge compared to single entry point/single entry inlet. Previously, the substrate portion at 3 mm from the substrate edge was observed to be a stagnant zone with undesirable deposition thickness and uniformity for a single entry point/single entry inlet. Additionally, the multi-annular channel described herein has been observed to lower risk of back diffusion as compared to a single entry point/single entry inlet, allow for independent control of the processing gas through the separate lines, and provide for a heated inert gas purge to protect the o-rings as compared to a single entry point/single entry inlet. Additionally, the multi-annular channel allows the use of PVC valves to improve corrosion protection, provides a simplified hardware design, such as face seals replaced with VCR fittings, and eliminates components necessary for a single entry point/single entry inlet, which allows for improved serviceability as compared to a single entry point/single entry inlet.

FIGS. 1A-1B depict the pathway gases travel to a gas dispersing channel 134 as described in embodiments herein. Process gasses are delivered from fluid delivery lines 210 and 220 into gas annular channels 260 and 265, through gas inlets 340, 345, and into the upper portion 350 and through the gas dispersing channel 134. FIGS. 2D, 3B, and 3C illustrate a pathway for a process gas or precursor gas to travel, that is, from fluid delivery line 210 into gas annular channel 265, through inlet 340, and into the upper portion 350. A second pathway extends from fluid delivery line 220 into gas annular channel 260, through inlet 345, and into the upper portion 350, as depicted in FIGS. 1B, 2D, 3B, and 3C.

FIG. 1B is a cross-sectional view of the upper portion 350 of gas dispersing channel 134 and the gas dispersing channel 134 of chamber lid assembly 132 showing simplified representations of gas flows therethrough. Although the exact flow pattern through the gas dispersing channel 134 is not known, it is believed that circular gas flow 174 (FIG. 1B) may travel from inlets 340, 345 through gas dispersing channel 134 with a circular flow pattern, such as a vortex flow, a helix flow, a spiral flow, a swirl flow, a twirl flow, a twist flow, a coil flow, a corkscrew flow, a curl flow, a whirlpool flow, derivatives thereof, or combinations thereof. As shown in FIG. 1B, the circular flow may be provided in a "processing region" as opposed to in a compartment separated from substrate 110. In one aspect, circular gas flow 174 may help to establish a more efficient purge of gas dispersing channel 134 due to the sweeping action of the vortex flow pattern across the inner surface of gas dispersing channel 134.

In one embodiment, FIG. 1B depicts distance 175 between point 176a at the surface of substrate 110 and point 176b at cylindrical upper portion 351 of gas dispersing channel 134. Distance 175 is long enough that circular gas flow 174 dissipates to a downwardly flow as a spiral flow across the surface of substrate 110 may not be desirable. It is believed that circular gas flow 174 proceeds in a laminar manner efficiently purging the surface of chamber lid assembly 132 and substrate 110. In another embodiment, distance 175 or gas dispersing channel 134 extending along central axis 133 has a length within a range from about 3 inches to about 9 inches, preferably, from about 3.5 inches to about 7 inches, and more preferably, from about 4 inches to about 6 inches, such as about 5 inches.

FIG. 1A depicts that at least a portion of lower surface 160 of chamber lid assembly 132 may be tapered from gas dispersing channel 134 to a peripheral portion of chamber lid assembly 132 to help provide an improved velocity profile of a gas flow from gas dispersing channel 134 across the surface of substrate 110 (i.e., from the center of the substrate to the edge of the substrate). Lower surface 160 may contain one or more tapered surfaces, such as a straight surface, a concave surface, a convex surface, or combinations thereof. In one embodiment, lower surface 160 is tapered in the shape of a funnel.

In one example, lower surface 160 is downwardly sloping to help reduce the variation in the velocity of the process gases traveling between lower surface 160 of chamber lid assembly 132 and substrate 110 while assisting to provide uniform exposure of the surface of substrate 110 to a reactant gas. In one embodiment, the ratio of the maximum area of the flow section over the minimum area of the flow section between a downwardly sloping lower surface 160 of chamber lid assembly 132 and the surface of substrate 110 is less than about 2, preferably, less than about 1.5, more preferably, less than about 1.3, and more preferably, about 1.

Not wishing to be bound by theory, it is believed that a gas flow traveling at a more uniform velocity across the surface of substrate 110 helps provide a more uniform deposition of the gas on substrate 110. It is believed that the velocity of the gas is directly proportional to the concentration of the gas which is in turn directly proportional to the deposition rate of the gas on substrate 110 surface. Thus, a higher velocity of a gas at a first area of the surface of substrate 110 versus a second area of the surface of substrate 110 is believed to provide a higher deposition of the gas on the first area. It is believed that chamber lid assembly 132 having lower surface 160, downwardly sloping, provides for more uniform deposition of the gas across the surface of substrate 110 because lower surface 160 provides a more uniform velocity and, thus, a more uniform concentration of the gas across the surface of substrate 110.

Various methods may also be employed to process a substrate according to embodiments of the invention. In one embodiment, a method of processing a substrate includes flowing two or more process gases from one or more fluid sources, such as gas sources 138, 139, through fluid delivery lines 210, 220 of a chamber lid assembly 132 and flowing the two or more process gases from the fluid delivery lines 210, 220 through two or more annular channels 260, 265 at least partially defined by a housing 200 of the chamber lid assembly 132. The housing has an inner region 290. The two or more process gases are flown from the two or more annular channels 260, 265 through an insert 300 disposed in the inner region 290 and into an upper portion 350 of a channel 134 in the chamber lid assembly 132. The insert 300 defines the upper portion 350 of the channel 134. The one or more process gases are flown through the channel 134 and into a reaction zone 164 above a substrate 110 disposed on a substrate support 112.

FIG. 1A depicts choke 162 located at a peripheral portion of chamber lid assembly 132 adjacent the periphery of substrate 110. Choke 162, when chamber lid assembly 132 is assembled to form a processing zone around substrate 110, contains any member restricting the flow of gas therethrough at an area adjacent the periphery of substrate 110.

In one specific embodiment, the spacing between choke 162 and substrate support 112 is between about 0.04 inches and about 2.0 inches, and preferably between 0.04 inches and about 0.2 inches. The spacing may vary depending on the gases being delivered and the process conditions during deposition. Choke 162 helps provide a more uniform pressure distribution within the volume or reaction zone 164 defined between chamber lid assembly 132 and substrate 110 by isolating reaction zone 164 from the non-uniform pressure distribution of pumping zone 166 (FIG. 1A).

Referring to FIG. 1A, in one aspect, since reaction zone 164 is isolated from pumping zone 166, a reactant gas or purge gas needs only adequately fill reaction zone 164 to ensure sufficient exposure of substrate 110 to the reactant gas or purge gas. In conventional chemical vapor deposition, prior art chambers are required to provide a combined flow of reactants simultaneously and uniformly to the entire surface of the substrate in order to ensure that the co-reaction of the reactants occurs uniformly across the surface of substrate 110. In atomic layer deposition, process chamber 100 sequentially introduces reactants to the surface of substrate 110 to provide absorption of alternating thin layers of the reactants onto the surface of substrate 110. As a consequence, atomic layer deposition does not require a flow of a reactant which reaches the surface of substrate 110 simultaneously. Instead, a flow of a reactant needs to be provided in an amount which is sufficient to adsorb a thin layer of the reactant on the surface of substrate 110.

Since reaction zone 164 may contain a smaller volume when compared to the inner volume of a conventional CVD chamber, a smaller amount of gas is required to fill reaction zone 164 for a particular process in an atomic layer deposition sequence. For example, in one embodiment, the volume of reaction zone 164 is about 1,000 $cm^3$ or less, preferably 500 $cm^3$ or less, and more preferably 200 $cm^3$ or less for a chamber adapted to process 200 mm diameter substrates. In one embodiment, the volume of reaction zone 164 is about 3,000 $cm^3$ or less, preferably 1,500 $cm^3$ or less, and more preferably 600 $cm^3$ or less for a chamber adapted to process 300 mm diameter substrates. In one embodiment, substrate support 112 may be raised or lowered to adjust the volume of reaction zone 164 for deposition. Because of the smaller volume of reaction zone 164, less gas, whether a deposition gas or a purge gas, is necessary to be flowed into process chamber 100. Therefore, the throughput of process chamber 100 is greater and the waste may be minimized due to the smaller amount of gas used reducing the cost of operation.

Chamber lid assembly 132 has been shown in FIGS. 1A-1B as containing lid cap 172 and lid plate 170 in which lid cap 172 and lid plate 170 form gas dispersing channel 134. In one embodiment, process chamber 100 contains lid cap 172 comprising a housing 200 having gas annular channels 260 and 265 as shown in FIGS. 1A-1B. An additional plate may be optionally disposed between lid plate 170 and lid cap 172 (not shown). The additional plate may be used to adjust (e.g., increase) the distance between lid cap 172 and lid plate 170 thereby respectively changing the length of dispersing channel 134 formed therethrough. In another embodiment, the optional additional plate disposed between lid plate 170 and lid cap 172 contains stainless steel. In other embodiments, gas dispersing channel 134 may be made integrally from a single piece of material.

Chamber lid assembly 132 may include cooling elements and/or heating elements depending on the particular gas being delivered therethrough. Controlling the temperature of chamber lid assembly 132 may be used to prevent gas decomposition, deposition, or condensation on chamber lid assembly 132. For example, water channels (not shown) may be formed in chamber lid assembly 132 to cool chamber lid assembly 132. In another example, heating elements (not shown) may be embedded or may surround components of chamber lid assembly 132 to heat chamber lid assembly 132. In one embodiment, components of chamber lid assembly 132 may be individually heated or cooled. For example, referring to FIG. 1A, chamber lid assembly 132 may contain lid plate 170 and lid cap 172 in which lid plate 170 and lid cap 172 form gas dispersing channel 134. Lid cap 172 may be maintained at one temperature range and lid plate 170 may be maintained at another temperature range. For example, lid cap 172 may be heated by being wrapped in heater tape or by using another heating device to prevent condensation of reactant gases and lid plate 170 may be maintained at ambient temperature. In another example, lid cap 172 may be heated and lid plate 170 may be cooled with water channels formed therethrough to prevent thermal decomposition of reactant gases on lid plate 170.

The components and parts of chamber lid assembly 132 may contain materials such as stainless steel, aluminum, nickel-plated aluminum, nickel, alloys thereof, or other suitable materials. In one embodiment, lid cap 172 and lid plate 170 may be independently fabricated, machined, forged, or otherwise made from a metal, such as aluminum, an aluminum alloy, steel, stainless steel, alloys thereof, or combinations thereof.

In one embodiment, inner surface 131 of gas dispersing channel 134 (including both inner surfaces of lid plate 170 and lid cap 172) and lower surface 160 of chamber lid assembly 132 may contain a mirror polished surface to help produce a laminar flow of a gas along gas dispersing channel 134 and lower surface 160 of chamber lid assembly 132. In another embodiment, the inner surface of fluid delivery lines 210 and 220 may be electropolished to help produce a laminar flow of a gas therethrough.

In an alternative embodiment, inner surface 131 of gas dispersing channel 134 (including both inner surfaces of lid plate 170 and lid cap 172) and lower surface 160 of chamber lid assembly 132 may contain a roughened surface or machined surfaces to produce more surface area across the surfaces. Roughened surfaces provide better adhesion of undesired accumulated materials on inner surface 131 and lower surface 160. The undesired films are usually formed as a consequence of conducting a vapor deposition process and may peel or flake from inner surface 131 and lower surface 160 to contaminate substrate 110. In one example, the mean roughness ($R_a$) of lower surface 160 and/or inner surface 131 may be at least about 10 μin, such as within a range from about 10 μin (about 0.254 μm) to about 200 μin (about 5.08 μm), preferably, from about 20 μin (about 0.508 μm) to about 100 μin (about 2.54 μm), and more preferably, from about 30 μin (about 0.762 μm) to about 80 μin (about 2.032 μm). In another example, the mean roughness of lower surface 160 and/or inner surface 131 may be at least about 100 μin (about 2.54 μm), preferably, within a range from about 200 μin (about 5.08 μm) to about 500 μin (about 12.7 μm).

FIG. 1A depicts control unit 180, such as a programmed personal computer, work station computer, or the like, coupled to process chamber 100 to control processing conditions. For example, control unit 180 may be configured to control flow of various process gases and purge gases from gas sources 138, 139, and 140 through valves 142A and 142B during different stages of a substrate process sequence. Illustratively, control unit 180 contains central processing unit (CPU) 182, support circuitry 184, and memory 186 containing associated control software 183.

Control unit 180 may be one of any form of general purpose computer processor that can be used in an industrial setting for controlling various chambers and sub-processors. CPU 182 may use any suitable memory 186, such as random access memory, read only memory, floppy disk drive, hard disk, or any other form of digital storage, local or remote. Various support circuits may be coupled to CPU 182 for supporting process chamber 100. Control unit 180 may be coupled to another controller that is located adjacent individual chamber components, such as programmable logic controllers 148A, 148B of valves 142A, 142B. Bi-directional communications between the control unit 180 and various other components of process chamber 100 are handled through numerous signal cables collectively referred to as signal buses 188, some of which are illustrated in FIG. 1A. In addition to control of process gases and purge gases from gas sources 138, 139, 140 and from programmable logic controllers 148A, 148B of valves 142A, 142B, control unit 180 may be configured to be responsible for automated control of other activities used in wafer processing—such as wafer transport, temperature control, chamber evacuation, among other activities, some of which are described elsewhere herein.

Referring to FIGS. 1A-1B, in operation, substrate 110 is delivered to process chamber 100 through slit valve 108 by a robot (not shown). Substrate 110 is positioned on substrate support 112 through cooperation of lift pins 120 and the robot. Substrate support 112 raises substrate 110 into close opposition to lower surface 160 of chamber lid assembly 132. A first gas flow may be injected into gas dispersing channel 134 of process chamber 100 by valve 142A together or separately (i.e., pulses) with a second gas flow injected into process chamber 100 by valve 142B. The first gas flow may contain a continuous flow of a purge gas from purge gas source 140 and pulses of a reactant gas from reactant gas source 138 or may contain pulses of a reactant gas from reactant gas source 138 and pulses of a purge gas from purge gas source 140. The second gas flow may contain a continuous flow of a purge gas from purge gas source 140 and pulses of a reactant gas from reactant gas source 139 or may contain pulses of a reactant gas from reactant gas source 139 and pulses of a purge gas from purge gas source 140.

Circular gas flow 174 travels through gas dispersing channel 134 as a vortex flow which provides a sweeping action across the inner surface of gas dispersing channel 134. Circular gas flow 174 dissipates to a downwardly flow towards the surface of substrate 110. The velocity of the gas flow reduces as it travels through gas dispersing channel 134. The gas flow then travels across the surface of substrate 110 and across lower surface 160 of chamber lid assembly 132. Lower surface 160 of chamber lid assembly 132, which is downwardly sloping, helps reduce the variation of the velocity of the gas flow across the surface of substrate 110. The gas flow then travels by choke 162 and into pumping zone 166 of process chamber 100. Excess gas, by-products, etc. flow into the pumping channel 179 and are then exhausted from process chamber 100 by vacuum system 178. In one aspect, the gas flow proceeds through gas dispersing channel 134 and between the surface of substrate 110 and lower surface 160 of chamber lid assembly 132 in a laminar manner which aids in uniform exposure of a reactant gas to the surface of substrate 110 and efficient purging of inner surfaces of chamber lid assembly 132.

Process chamber 100, as illustrated in FIGS. 1A-1B, has been described herein as having a combination of features. In one aspect, process chamber 100 provides reaction zone 164 containing a small volume in compared to a conventional CVD chamber. Process chamber 100 requires a smaller amount of a gas, such as a reactant gas or a purge gas, to fill reaction zone 164 for a particular process. In another aspect, process chamber 100 provides chamber lid assembly 132 having a downwardly sloping or funnel shaped lower surface 160 to reduce the variation in the velocity profile of a gas flow traveling between the bottom surface of chamber lid assembly 132 and substrate 110. In still another aspect, process chamber 100 provides gas dispersing channel 134 to reduce the velocity of a gas flow introduced therethrough. In still another aspect, process chamber 100 provides fluid delivery lines at an angle α from the center of gas dispersing channel 134. Process chamber 100 provides other features as described elsewhere herein. Other embodiments of a chamber adapted for atomic layer deposition incorporate one or more of these features.

While foregoing is directed to the preferred embodiment of the invention, other and further embodiments of the invention may be devised without departing from the basic scope thereof, and the scope thereof is determined by the claims that follow.

What is claimed is:

1. A chamber lid assembly comprising:
   a lid having:
      a channel having an upper portion and a lower portion, wherein the channel extends along a central axis of the lid;
      a housing having an inner region and at least partially defining two or more annular channels surrounding the channel; and
      a tapered bottom surface extending from the lower portion of the channel to a peripheral portion of the chamber lid assembly; and
   an insert comprising a coupling lid having a truncated portion, the insert configured to at least partially define the upper portion of the channel to provide a desired gas flow characteristic into the upper portion of the channel and having a plurality of apertures formed therein disposed adjacent the two or more annular channels in the housing, the plurality of apertures fluidly coupled with the two or more annular channels.

2. The chamber lid assembly of claim 1, wherein the housing further comprises an annular manifold disposed on a base with the annular manifold defining the inner region.

3. The chamber lid assembly of claim 2, wherein the two or more annular channels are disposed in a vertically spaced manner along the central axis.

4. The chamber lid assembly of claim 2, further comprising a purge line disposed in the annular manifold.

5. The chamber lid assembly of claim 4, wherein the purge line comprises a horizontal gas transport line coupled with one or more gap purge lines that are fluidly coupled with the inner region.

6. The chamber lid assembly of claim 5, wherein at least one gap purge line is coupled with the inner region above the two or more annular channels and at least one gap purge line is coupled with the inner region below the two or more annular channels.

7. The chamber lid assembly of claim 5, wherein each gap purge line further comprises a circumferentially formed annular channel that spans the inner region.

8. The chamber lid assembly of claim 5, wherein the purge line further comprises a vertically disposed line disposed in the annular manifold.

9. The chamber lid assembly of claim 2, wherein the coupling lid having the truncated portion is adapted to be coupled to a top portion of the housing, the insert further comprising a vertical body at least partially defining the upper portion of the channel and adapted to be disposed in and flush with the inside of the annular manifold.

10. The chamber lid assembly of claim 9, wherein the insert further comprises one or more sets of the plurality of apertures disposed along a horizontal plane through the vertical body to be coupled with each annular channel and provide a multi-aperture inlet between each annular channel and the upper portion.

11. The chamber lid assembly of claim 10, wherein each set of the plurality of apertures is vertically disposed from one another along the central axis.

12. The chamber lid assembly of claim 9, wherein the upper portion of the channel is defined by the vertical body to comprise a cylindrical shape.

13. The chamber lid assembly of claim 12, wherein the vertical body of the insert further comprises a cylindrical upper portion and an expanding bottom portion with the expanding bottom portion disposed below a bottom set of a plurality of apertures.

14. The chamber lid assembly of claim 13, wherein the bottom set of a plurality of apertures comprises between 2 and 10 apertures.

15. The chamber lid assembly of claim 9, wherein each of the apertures is disposed from about 0° to 60° in a horizontal manner from the vertical body and is disposed from about 0° to 60° in a vertical manner from the vertical body.

16. The chamber lid assembly of claim 1, wherein each of the annular channels is coupled with a fluid delivery line and each fluid delivery line is coupled with one or more fluid sources.

17. The chamber lid assembly of claim 1, wherein each annular channel circumferentially spans the inner region and provides for fluid communication in 360°.

18. The chamber lid assembly of claim 1, wherein each of the apertures is a rectangular shape, a cylindrical tube, or a tear drop shape.

* * * * *